(12) United States Patent
Huang et al.

(10) Patent No.: US 10,825,931 B2
(45) Date of Patent: Nov. 3, 2020

(54) SEMICONDUCTOR DEVICE WITH UNDERCUTTED-GATE AND METHOD OF FABRICATING THE SAME

(71) Applicant: NANYA TECHNOLOGY CORPORATION, New Taipei (TW)

(72) Inventors: Ching-Chia Huang, Taipei (TW); Tseng-Fu Lu, New Taipei (TW); Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/894,954

(22) Filed: Feb. 13, 2018

(65) Prior Publication Data

US 2019/0252549 A1 Aug. 15, 2019

(51) Int. Cl.
*H01L 29/78* (2006.01)
*H01L 29/66* (2006.01)
*H01L 29/06* (2006.01)
*H01L 29/423* (2006.01)
*H01L 27/108* (2006.01)
*H01L 21/762* (2006.01)
*H01L 21/3065* (2006.01)

(52) U.S. Cl.
CPC .... *H01L 29/7853* (2013.01); *H01L 21/76224* (2013.01); *H01L 27/10826* (2013.01); *H01L 29/66795* (2013.01); *H01L 29/66818* (2013.01); *H01L 21/3065* (2013.01); *H01L 29/0665* (2013.01)

(58) Field of Classification Search
CPC .................... H01L 21/76224; H01L 29/66818
See application file for complete search history.

(56) References Cited

U.S. PATENT DOCUMENTS

| 2006/0071275 A1* | 4/2006 | Brask ................ H01L 29/66795 257/350 |
| 2007/0001173 A1* | 1/2007 | Brask ...................... H01L 29/51 257/67 |
| 2007/0205459 A1* | 9/2007 | Cho ........................ B82Y 10/00 257/321 |
| 2011/0079829 A1* | 4/2011 | Lai .................... H01L 29/41791 257/288 |

(Continued)

FOREIGN PATENT DOCUMENTS

| TW | 200725882 A | 7/2007 |
| TW | 200901444 A | 1/2009 |

*Primary Examiner* — Kenneth Parker
*Assistant Examiner* — Long H Le
(74) *Attorney, Agent, or Firm* — CKC & Partners Co., LLC

(57) ABSTRACT

A semiconductor device includes a semiconductor substrate, a dielectric layer, a gate structure, a source semiconductor feature, and a drain semiconductor feature. The semiconductor substrate has an active area and a shallow trench isolation (STI) structure surrounding the active area. The semiconductor substrate includes a protrusion structure in the active area and has an undercut at a periphery of the active area. The dielectric layer overlays the protrusion structure of the semiconductor substrate and fills at least a portion of the undercut of the protrusion structure. The gate structure crosses over the protrusion structure. The source semiconductor feature and the drain semiconductor feature are located in the active area and positioned at opposite sides of the gate structure.

10 Claims, 11 Drawing Sheets

(56) References Cited

U.S. PATENT DOCUMENTS

| | | | | |
|---|---|---|---|---|
| 2011/0127611 A1* | 6/2011 | Lee | ................... | H01L 29/41791 |
| | | | | 257/368 |
| 2015/0340452 A1* | 11/2015 | Xie | ................... | H01L 21/76897 |
| | | | | 257/401 |
| 2016/0013287 A1* | 1/2016 | Yamamoto | .......... | H01L 29/0607 |
| | | | | 257/349 |
| 2016/0308058 A1* | 10/2016 | Cheng | ..................... | H01L 21/76 |
| 2017/0154990 A1* | 6/2017 | Sung | ..................... | H01L 29/785 |

\* cited by examiner

SEMICONDUCTOR DEVICE WITH UNDERCUTTED-GATE AND METHOD OF FABRICATING THE SAME

BACKGROUND

Field of Invention

The present invention relates to a semiconductor device and a method of fabricating the same. More particularly, the present invention relates to a transistor structure suited for high-density dynamic random access memory (DRAM) devices.

Description of Related Art

The scaling down of the transistor and the capacitor of a Dynamic Random Access Memory (DRAM) cell is a constant effort in order to increase the packing density and improve the DRAM's overall performance. However, as the transistor in the cell is reduced in size, the standard channel length of the transistor (the width of the gate) is also reduced. A shorter channel length leads to more pronounced short-channel effects and greater subthreshold leakage of the cell's transistor, and ultimately degrades the performance of the cell.

SUMMARY

An aspect of the present invention provides a semiconductor device. The semiconductor device comprises a semiconductor substrate, a dielectric layer, a gate structure, a source semiconductor feature, and a drain semiconductor feature. The semiconductor substrate has an active area and a shallow trench isolation (STI) structure surrounding the active area. The semiconductor substrate comprises a protrusion structure in the active area and having an undercut at a periphery of the active area. The dielectric layer overlays the protrusion structure of the semiconductor substrate and fills at least a portion of the undercut of the protrusion structure. The gate structure crosses over the protrusion structure. The source semiconductor feature and the drain semiconductor feature are located in the active area and positioned at opposite sides of the gate structure.

In some embodiments of the present invention, the gate structure extends in a first direction, and the undercut extends in a second direction that is substantially perpendicular to the first direction.

In some embodiments of the present invention, each of the source semiconductor feature and the drain semiconductor feature has a top surface higher than a top surface of the protrusion structure.

In some embodiments of the present invention, the protrusion structure has a top and a bottom. A width of the bottom is about 99-70% of a width of the top.

In some embodiments of the present invention, the width of the bottom is about 25 nm to 35 nm.

In some embodiments of the present invention, the width of the top is about 30 nm to 38 nm.

In some embodiments of the present invention, the STI structure comprises a first portion and a second portion. The first portion is under and aligned with the gate structure, and the second portion is free of overlapping with the gate structure.

In some embodiments of the present invention, the second portion has a top surface that is higher than a top surface of the first portion of the STI structure.

In some embodiments of the present invention, the semiconductor device further comprises a barrier layer overlaying the dielectric layer.

In some embodiments of the present invention, a height of the gate structure ranges from 145 nm to 165 nm.

In some embodiments of the present invention, a height of the protrusion structure ranges from 35 nm to 45 nm.

In some embodiments of the present invention, the gate structure comprises polysilicon or a metal.

Another aspect of the present invention provides a method of fabricating a semiconductor device. The method comprises following operations: (i) providing a semiconductor substrate having an active area, a shallow trench isolation (STI) structure surrounding the active area, and a doped region located in the active area; (ii) etching the semiconductor substrate to form a first protrusion structure, a source semiconductor feature, a drain semiconductor feature, and an etched STI structure, wherein the etched STI structure comprises a first portion and a second portion, the second portion of the etched STI structure has a top surface that is higher than a top surface of the first protrusion structure, and the top surface of the first protrusion structure is higher than a top surface of the first portion of the etched STI structure; (iii) etching the first protrusion structure to form a second protrusion structure, wherein the second protrusion structure has an undercut at a periphery of the active area; (iv) conformally forming a dielectric layer over the second protrusion structure; and (v) forming a gate structure crossing over the second protrusion structure, wherein the gate structure extends in a first direction, and the undercut extends in a second direction that is substantially perpendicular to the first direction.

In some embodiments of the present invention, before the operation (v), the method further comprises an operation of conformally forming a barrier layer over the dielectric layer.

In some embodiments of the present invention, the operation (iii) comprises following sub-operations: (a) forming a hard mask layer on the first protrusion structure; (b) etching the first protrusion structure by using the hard mask layer as an etching mask to form the second protrusion structure; and (c) removing the hard mask layer.

In some embodiments of the present invention, the method further comprises etching the first portion of the etched STI structure in sub-operation (b), and an etching rate of the first protrusion structure is greater than an etching rate of the first portion of the etched STI structure.

In some embodiments of the present invention, the operation (iii) is performed by an anisotropic etching process.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
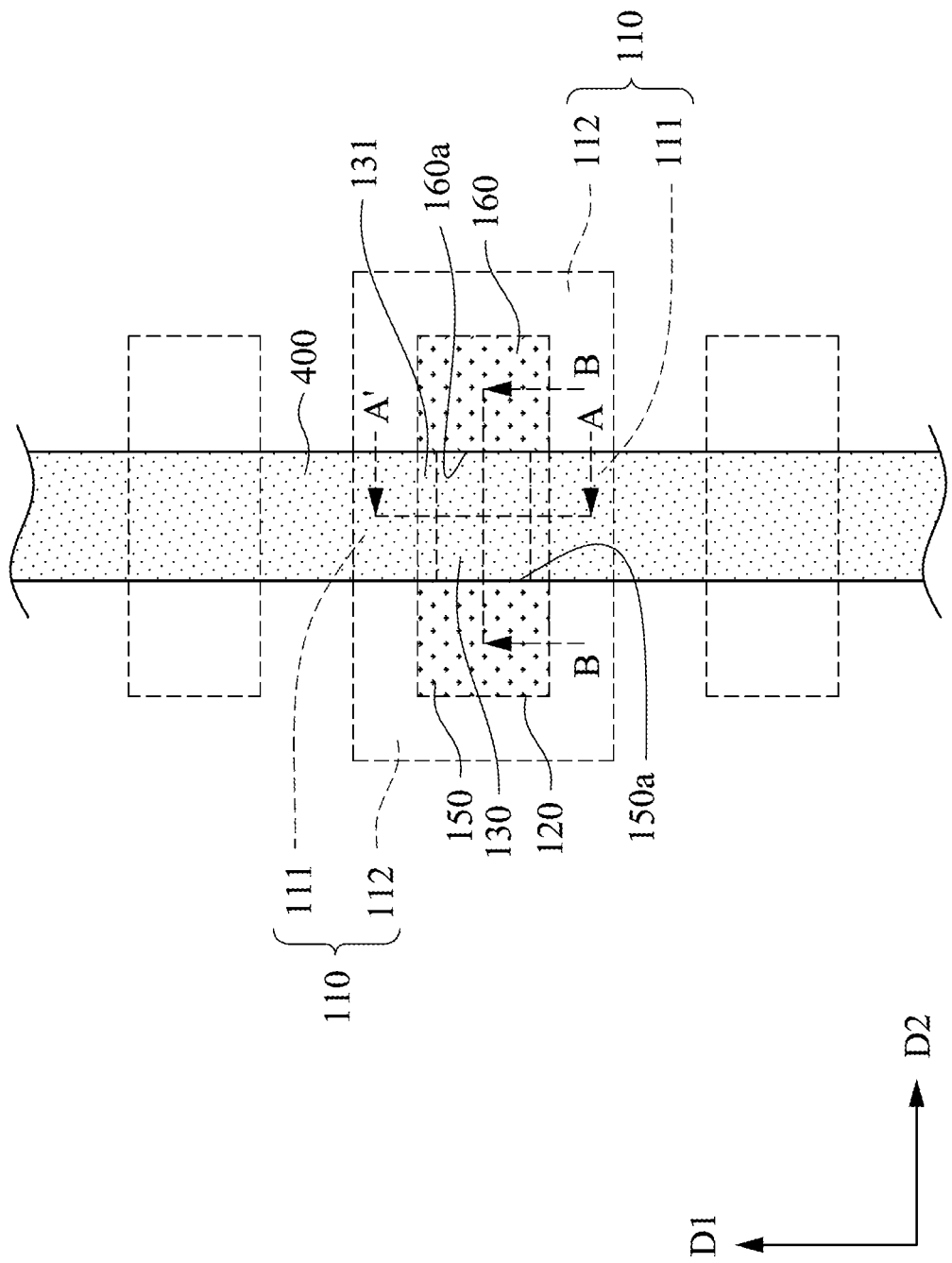
FIG. 1 is a top view illustrating a portion of a DRAM device according to some embodiments of the present invention.

Reference will now be made in detail to the present embodiments of the invention, examples of which are illustrated in the accompanying drawings. Wherever possible, the same reference numbers are used in the drawings and the description to refer to the same or like parts.

Figure 2B:
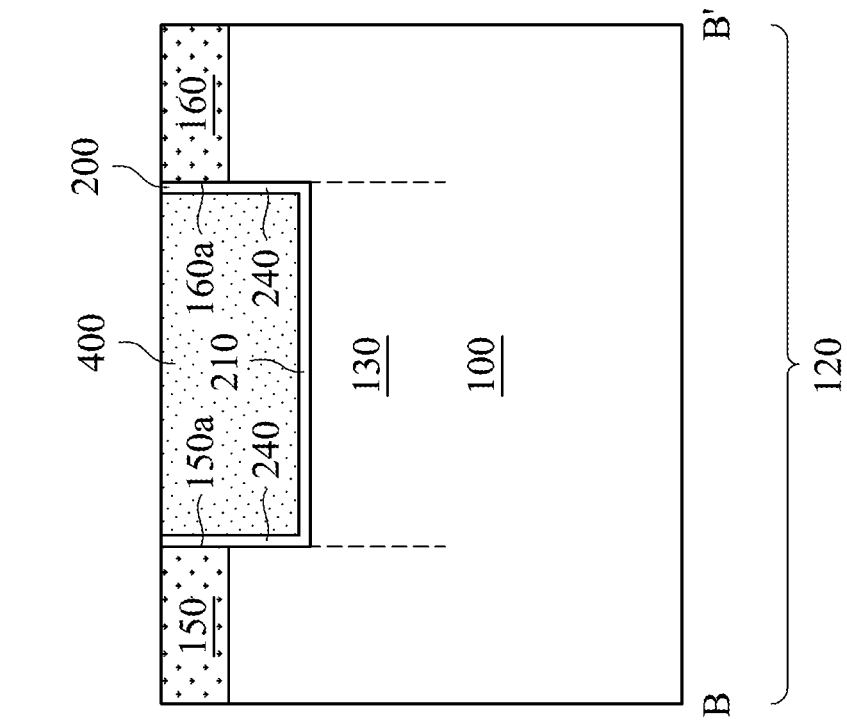
FIG. 2A and FIG. 2B are a cross-sectional views corresponding to FIG. 1, taken along the line A-A' and line B-B', respectively, according to some embodiments of the present invention.
Figure 2A:
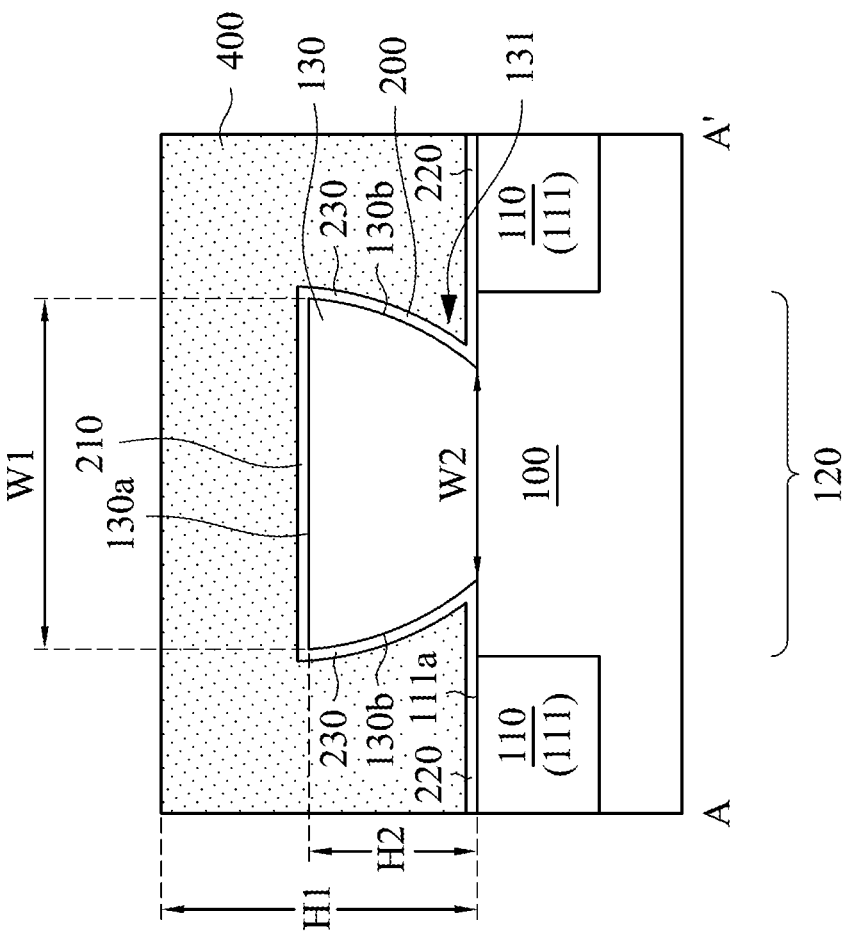

Please refer to FIG. 1, FIG. 2A, and FIG. 2B. FIG. 1 is a top view illustrating a portion of a semiconductor device such as a DRAM device according to some embodiments of the present invention. Further, FIG. 2A is a cross-sectional view corresponding to FIG. 1, taken along the line A-A', and FIG. 2B is a cross-sectional view corresponding to FIG. 1, taken along the line B-B'. Please refer to the top view and the respective cross-sectional views to have a better understanding for the present invention. In order to facilitate the understanding of the semiconductor device such as the DRAM device provided in the present invention, the structure of the transistor portion is depicted in FIG. 2A and FIG. 2B, while the capacitor portion is omitted. However, it will be apparent to those skilled in the art that the capacitor portion may be a stack capacitor or a trench capacitor coupled to at least one of conductive features (e.g., a source feature or a drain feature) of the transistor portion.

As shown in FIG. 1, FIG. 2A, and FIG. 2B, the semiconductor device (e.g., DRAM device) comprises a semiconductor substrate 100, a dielectric layer 200, a gate structure 400 extending in a first direction D1, a source semiconductor feature 150, and a drain semiconductor feature 160.

The semiconductor substrate 100 has an active area 120 and a shallow trench isolation (STI) structure 110 surrounding the active area 120. In an embodiment of the present invention, the semiconductor substrate 100 may be a single crystal semiconductor substrate or a polycrystalline semiconductor substrate made of silicon or silicon carbide, a compound semiconductor substrate made of silicon germanium or the like, a silicon on insulator (SOI) substrate, or the like. In an embodiment of the present invention, the STI structure 110 comprises tetraethoxysilane (TEOS), silicon oxide, silicon nitride, silicon oxy-nitride or fluoride-doped silicate (FSG). The STI structure 110 comprises a first portion 111 under and aligned with the gate structure 400 and a second portion 112 that is free of overlapping with the gate structure 400. It should be understood that a top surface of the second portion 112 of the STI structure 110 is higher than a top surface of the first portion 111 of the STI structure 110. The semiconductor substrate 100 further comprises a protrusion structure 130 in the active area 120. Specifically, the protrusion structure 130 is disposed between the source semiconductor feature 150 and the drain semiconductor feature 160. The top surface 130a of the protrusion structure 130 is higher than the top surfaces of the first portion 111 of the STI structure 110, as shown in FIG. 2A. Further, the top surfaces of the semiconductor features 150, 160 are higher than the top surface 130a of the protrusion structure 130, as shown in FIG. 2B. In addition, the top surface 130a of the protrusion structure 130 is on a level between the top surface of the second portion 112 and the top surface of the first portion 111 of the STI structure 110. In an embodiment of the present invention, the height H2 of the protrusion structure 130, relative to the top of the first portion 111 of the STI structure 110, ranges from 35 nm to 45 nm, for example, 37 nm, 39 nm, 41 nm or 43 nm.

Furthermore, the protrusion structure 130 includes at least one undercut 131 extending in the second direction D2 and positioned at the periphery of the active area 120, as shown in FIG. 1 and FIG. 2A. In some embodiments, the protrusion structure 130 includes a pair of undercuts 131 positioned at opposite sides of the protrusion structure 130. The pair of undercuts 131 may extend along the second direction D2 and located at the periphery of the active area 120. It is noted that no undercut is present at the other edges along the first direction D1 of the protrusion structure 130 according to some embodiments. The first direction D1 is different from (e.g., substantially perpendicular to) the second direction D2. The top and the bottom of the protrusion structure 130 respectively have a first width W1 and a second width W2, and the second width W2 of the bottom is about 99-70% of the first width W1 of the top. It should be understood that when the second width W2 of the bottom is less than about 70% of the first width W1 of the top, the structure may be fragile according some embodiments. When the second width W2 of the bottom is greater than about 99% of the first width W1 of the top, it may not achieve certain technical effects, which will be discussed below. In an embodiment of the present invention, the width W2 of the bottom is about 25 nm to 35 nm, for example, 27 nm, 29 nm, 31 nm or 33 nm. In an embodiment of the present invention, the width W1 of the top is about 30 nm to 38 nm, for example, 32 nm, 34 nm or 36 nm.

The dielectric layer 200 overlays the protrusion structure 130 of the semiconductor substrate 100 and fills at least a portion of the undercut 131 of the protrusion structure 130. The dielectric layer 200 conformally covers the protrusion structure 130. In an embodiment of the present invention, the dielectric layer 200 is conformally disposed on the protrusion structure 130 and the first portion 111 of the STI structure 110, as shown in FIG. 2A. Specifically, the dielectric layer 200 has a first portion 210 disposed on the top surface 130a of the protrusion structure 130, a second portion 220 disposed on top surfaces 111a of the first portion 111 of the STI structure 110, a third portion 230 disposed on sidewalls 130b of the protrusion structure 130, and a forth portion 240 disposed on a sidewall 150a of the source semiconductor feature 150 and a sidewall 160a of the drain semiconductor feature 160. That is, the dielectric layer 200 is configured to separate or insulate the gate structure 400 from the semiconductor substrate 100, the source semiconductor feature 150, and the drain semiconductor feature 160. In an embodiment of the present invention, the thickness of the dielectric layer 200 ranges from 1 nm to 4 nm, for example, 2 nm or 3 nm. In an embodiment of the present invention, the dielectric layer 200 may include a dielectric material such as, silicon oxide, silicon nitride, silicon oxinitride, dielectric with a high dielectric constant (high k), and/or combinations thereof.

The gate structure 400 crosses over the protrusion structure 130 and is spaced from the semiconductor substrate 100 by the dielectric layer 200. As discussed above, certain technical effects can be achieved if the ratio of the second width W2 to the first width W1 of the protrusion structure 130 is in certain range, e.g. about 70-99%. Specifically, as shown in FIG. 2A, the gate structure 400 fills the undercut 131 such that the contact area of the gate structure 400 is thus increased as compared with a structure that doesn't have an undercut. In addition, as the difference between W1 and W2 increases, the contact area of the gate structure 400 also increases accordingly, and which allows the gate structure 400 to more efficiently control the electrons flowing from the source semiconductor feature 150 to the drain semiconductor feature 160 through the protrusion structure 130. It should be understood that although only one transistor is depicted in FIG. 1, in some embodiments, the semiconductor device includes more than one transistor. In such embodiments, transistors are aligned with each other, and each transistor is controlled by the same gate structure extending along the first direction D1. In the embodiments where the semiconductor device is a DRAM device, the gate structure extending along the first direction D1 is also referred to as a word line. In an embodiment of the present invention, the gate structure 400 has a height H1, relative to the top surface 111a of the STI structure 110, ranged from 145 nm to 165 nm, for example, 150 nm, 155 nm, or 160 nm. In an embodiment of the present invention, the gate structure 400 may include polysilicon, a metal such as aluminum (Al), cooper (Cu), or tungsten (W), other conductive materials, or combinations thereof.

The source semiconductor feature 150 and the drain semiconductor feature 160 are located in the active area 120 and positioned at opposite sides of the gate structure 400. Specifically, the source semiconductor feature 150 is spaced from the drain semiconductor feature 160 by the gate structure 400. Moreover, the forth portion 240 of the dielectric layer 200 separates the gate structure 400 from the source semiconductor feature 150 and the drain semiconductor feature 160. In addition, the source semiconductor feature 150 and the drain semiconductor feature 160 may be formed by a doping process, and the depth of doping may be appropriately varied by those skilled in the art so to form suitable depths of the source semiconductor feature 150 and the drain semiconductor feature 160. In an embodiment of the present invention, the source semiconductor feature 150 and the drain semiconductor feature 160 are doped with N-type dopants such as phosphorus or arsenic.

Figure 3B:
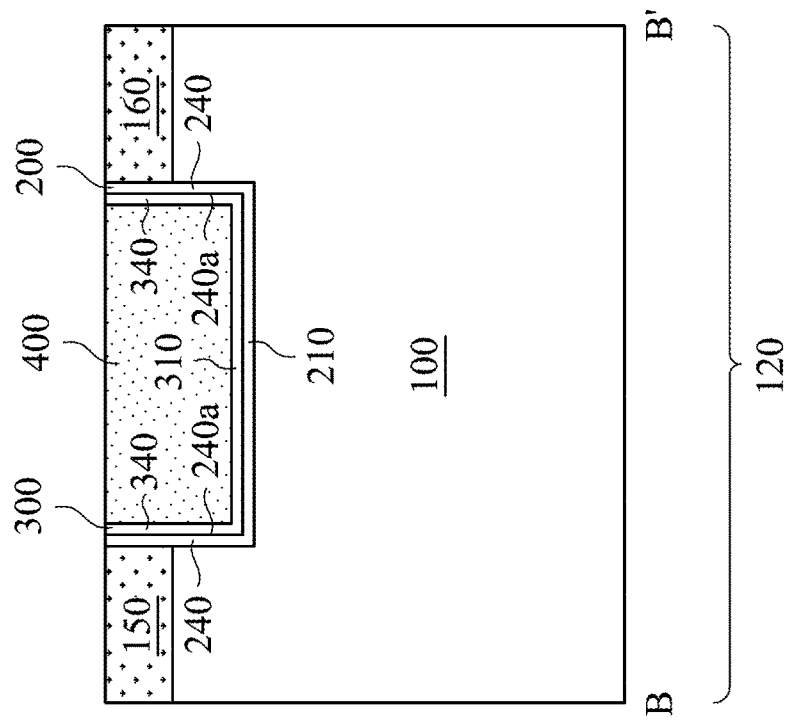
FIG. 3A and FIG. 3B are a cross-sectional views corresponding to FIG. 1, taken along the line A-A' and line B-B', respectively, according to other embodiments of the present invention.
Figure 3A:
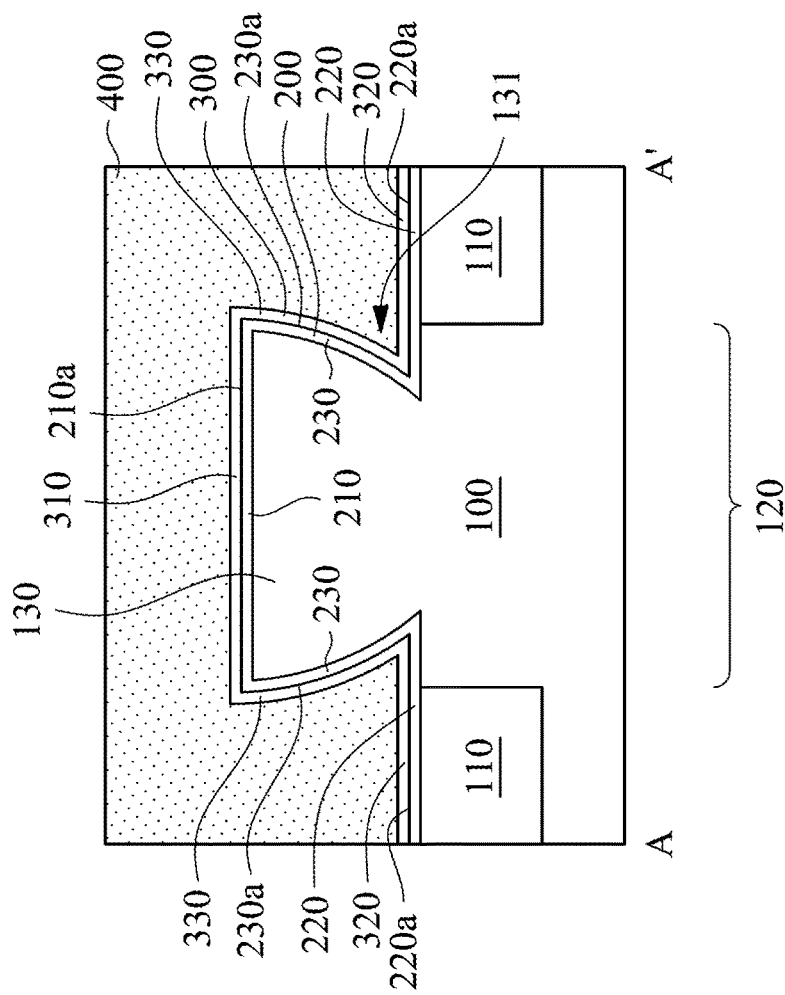

Please refer to FIG. 1, FIG. 3A, and FIG. 3B. FIG. 3A is a cross-sectional view corresponding to FIG. 1, taken along the line A-A', and FIG. 3B is a cross-sectional view corresponding to FIG. 1, taken along the line B-B', according to other embodiments of the present invention. Components similar to those in FIG. 2A and FIG. 2B are given the same reference numbers in FIG. 3A, and FIG. 3B. FIG. 3A and FIG. 3B show a similar structure as that in FIG. 2A and FIG. 2B, except that the semiconductor device in FIG. 3A and FIG. 3B further includes a barrier layer 300 overlaying the dielectric layer 200. It should be understood that the barrier layer 300 is used to prevent the metal ions of the subsequently formed gate structure 400 from diffusing or penetrating into the layers thereunder (e.g., the dielectric layer 200 or the semiconductor substrate 100) to avoid contaminating the layers. Accordingly, the barrier layer 300 is conformally disposed on the dielectric layer 200 and interposed between the dielectric layer 200 and the gate structure 400. Specifically, the barrier layer 300 has a first portion 310 disposed on a top surface 210a of the first portion 210 of the dielectric layer 200, a second portion 320 disposed on top surfaces 220a of the second portion 220 of the dielectric layer 200, a third portion 330 disposed on sidewalls 230a of the third portion 230 of the dielectric layer 200, and a forth portion 340 disposed on sidewalls 240a of the forth portion 240 of the dielectric layer 200. That is, the barrier layer 300 is configured to separate the gate structure 400 from the dielectric layer 200. In an embodiment of the present invention, a thickness of the barrier layer 300 ranges from 1 nm to 4 nm, for example, 2 nm or 3 nm. In an embodiment of the present invention, the barrier layer 300 may include a material such as, titanium nitride, tantalum nitride, and/or combinations thereof. In an embodiment of the present invention, the barrier layer 300 may include multiple layers stacked on the top of one another.

Figure 4:
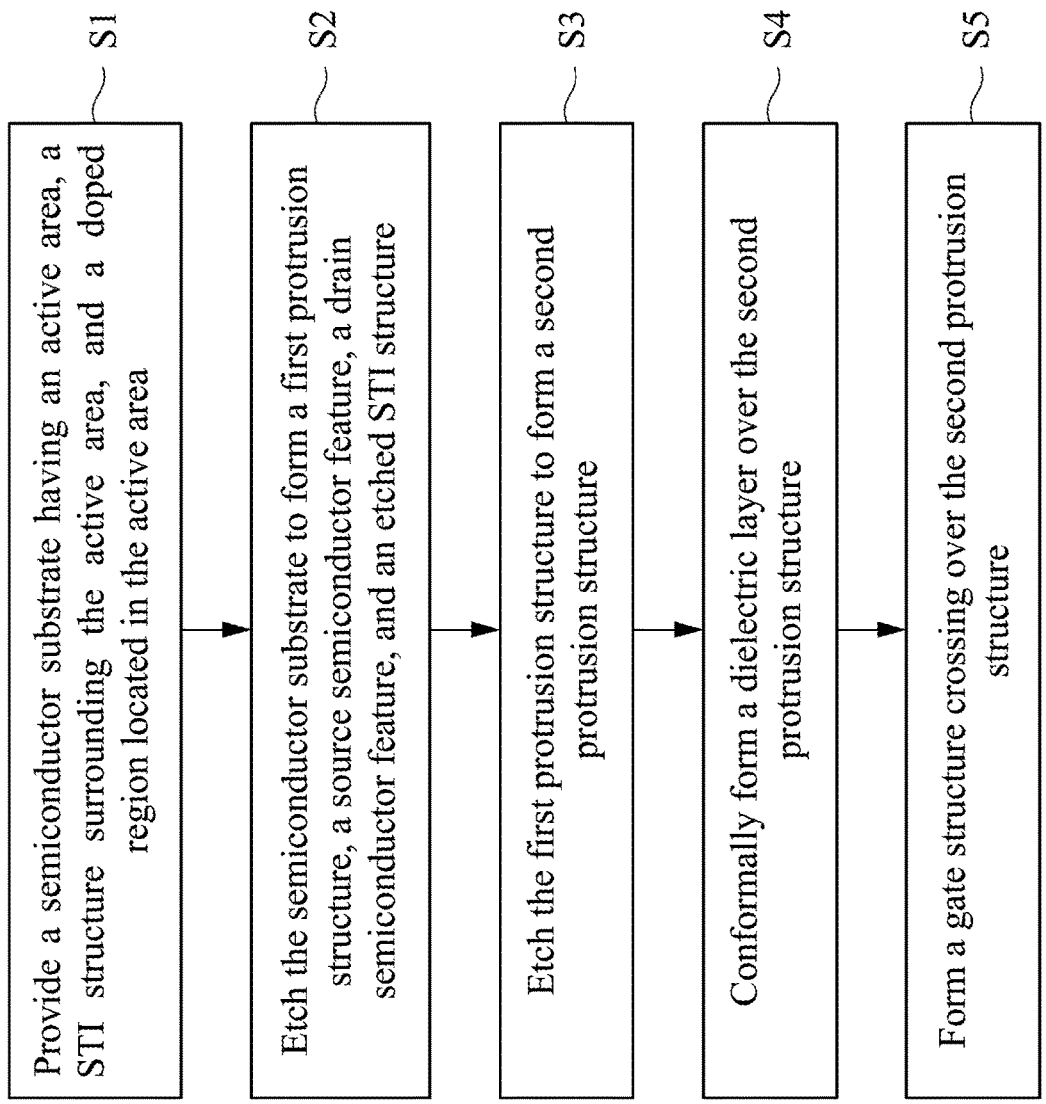
FIG. 4 is a flowchart illustrating a method for forming a semiconductor device according to some embodiments of the present invention.

FIG. 4 is a flowchart illustrating a method for forming a semiconductor device according to some embodiments of the present invention. It is noted that the method depicted in FIG. 4 is merely an example, and is not intended to limit the present invention. Accordingly, additional operations may be performed before, during, and/or after the method depicted in FIG. 4, and some other operations may only be briefly described herein. FIGS. 5A, 5B, 6A, 6B, 7A, 7B, 8A, 8B, 9A, 9B, 10A, and 10B are cross-sectional views illustrating the method of FIG. 4 at various process stages, in which the figures with an "A" designation are along line AA' in FIG. 1 and figures with an "B" designation are along line BB' in FIG. 1. For a better understanding of the present invention, please refer to the top view of FIG. 1 when reading the following detailed description of the operations of the method depicted in FIG. 4.

Figure 5B:
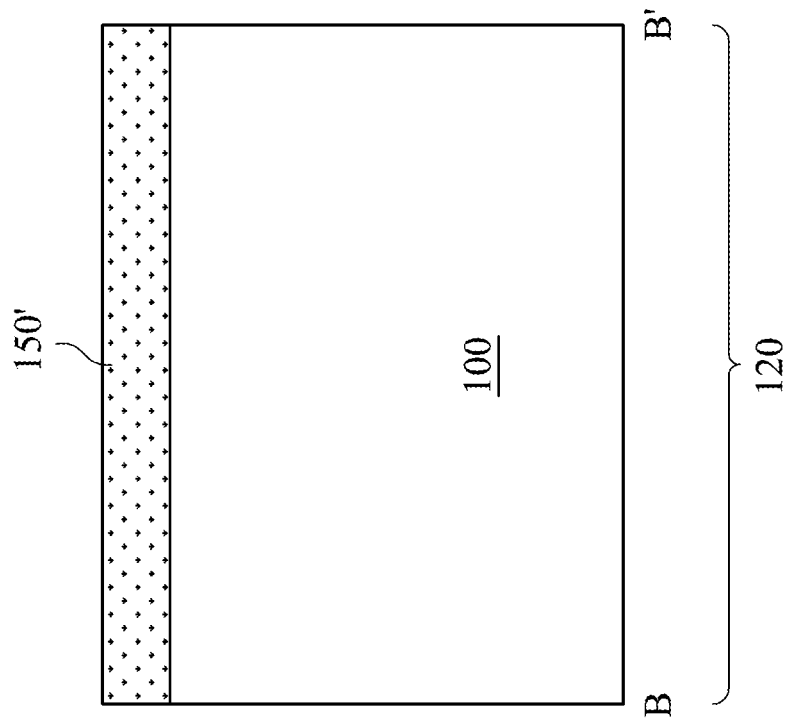
FIGS. 5B, 6B, 7B, 8B, 9B, and 10B are cross-sectional views illustrating various stages of a method for forming a semiconductor device according to some embodiments of the present invention, taken along the line B-B' of FIG. 1.
Figure 5A:
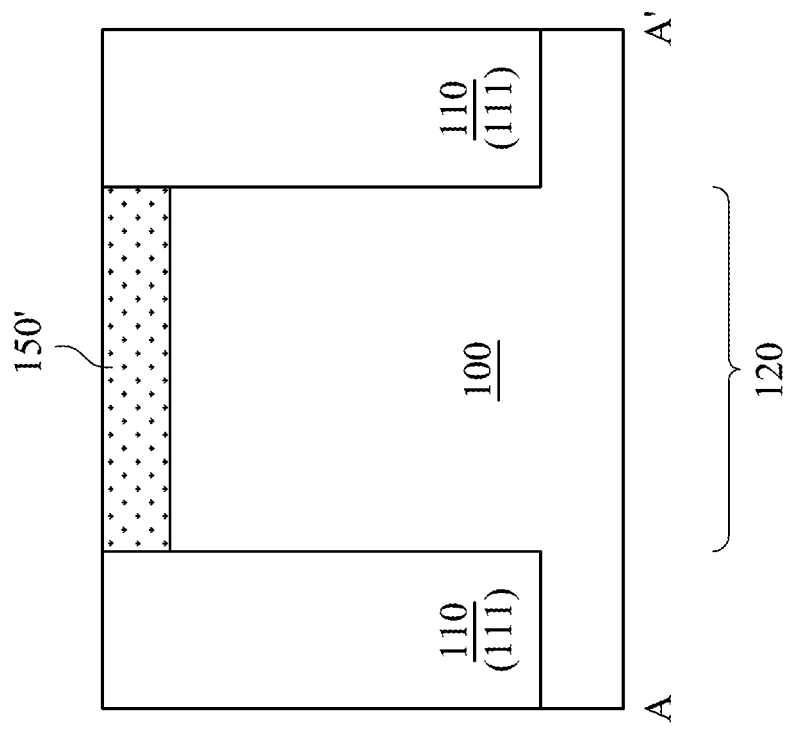
FIGS. 5A, 6A, 7A, 8A, 9A, and 10A are cross-sectional views illustrating various stages of a method for forming a semiconductor device according to some embodiments of the present invention, taken along the line A-A' of FIG. 1.

As depicted in FIG. 4, in operation S1, a semiconductor substrate having an active area, a STI structure surrounding the active area, and a doped region located in the active area is provided. As shown in FIG. 1 and FIGS. 5A and 5B, a semiconductor substrate 100 is provided, which includes an active area 120, a STI structure 110 surrounding the active area 120, and a doped region 150' located in the active area 120. In some embodiments of the present invention, the STI structure 110 surrounds the active area 120 and is formed by etching the semiconductor substrate 100 to form a recess, and followed by a deposition process to fill the recess with a dielectric material. The dielectric material, for example, may include tetraethoxysilane (TEOS), silicon oxide, silicon nitride, silicon oxy-nitride or fluoride-doped silicate (FSG). Thereafter, the doped region 150' may be formed by a doping process such as an ion implantation process using one or more suitable dopants, for example N-type dopants such as phosphorus or arsenic.

Figure 6B:
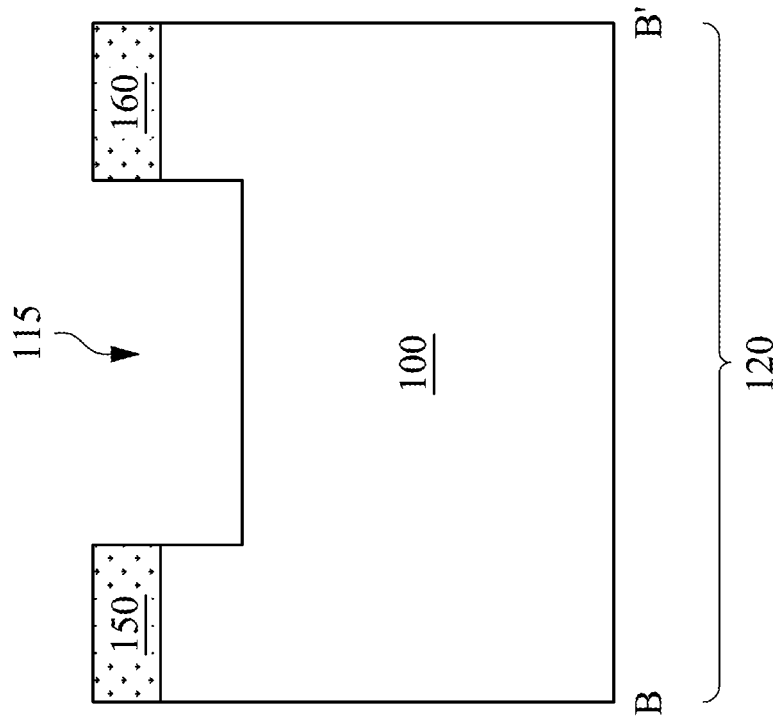
Figure 6A:
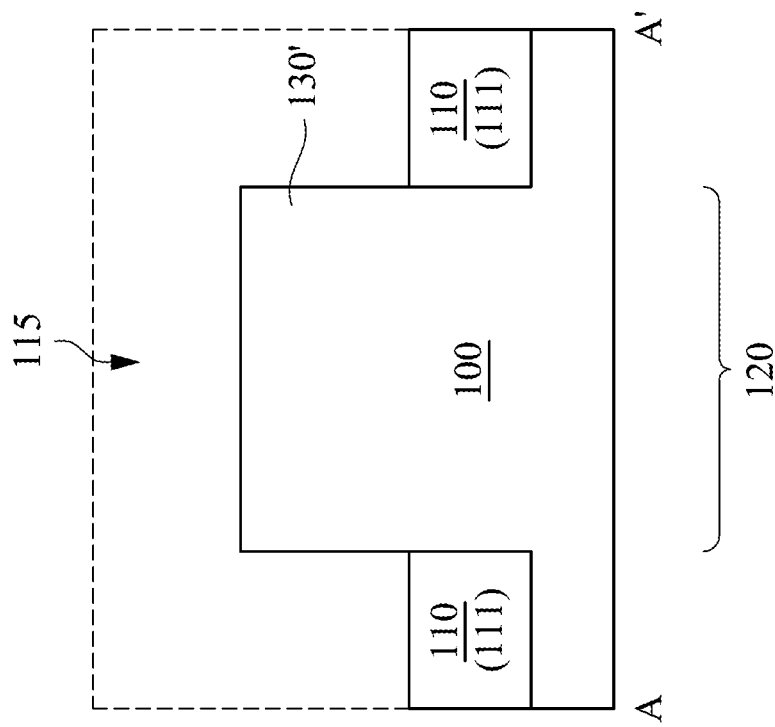

In operation S2 of FIG. 4, the semiconductor substrate 100 is selectively etched to form a first protrusion structure 130', a source semiconductor feature 150, a drain semiconductor feature 160, and an etched STI structure 110, as shown in FIGS. 1, 6A, and 6B. Particularly, the region of the semiconductor substrate 100, where the gate structure 400 will be subsequently formed, is etched to form a trench 115 extending in the first direction D1, but the other region of the semiconductor substrate 100 is not etched. For example, a masking layer (not shown) with a desired opening may be formed first, and then an etching process is performed to form the trench 115. Particularly, the trench 115 cuts off the doped region 150' to form a source semiconductor feature 150 and a drain semiconductor feature 160, as shown in FIG.

6B. In particular, the remained portions of the doped region 150' at opposite side of the trench 115 form the source semiconductor feature 150 and the drain semiconductor feature 160. Since only a portion of the STI structure 110 is etched, the etched STI structure 110 comprises an etched portion 111 (also referred to as the first portion 111 hereinafter) and an unetched portion 112 (also referred to as the second portion 112 hereinafter). Furthermore, the top surface of the second portion 112 is higher than the top surface of the first portion 111 of the etched STI structure 110. The etchant used in the etching process may be appropriately selected such that the etching rate of the STI structure 110 is greater than the etching rate of the semiconductor substrate 100. Therefore, a first protrusion structure 130' is formed protruding from the first portion 111 of the etched STI structure 110 in the trench 115. Thus, the top surface of the first protrusion structure 130' is higher than the top surface of the first portion 111 of the etched STI structure 110, but is lower than the top surfaces of the source and drain semiconductor features 150, 160 as well as the second portion 112 of the etched STI structure 110. In an embodiment of the present invention, the etching of forming the trench 115 may include an anisotropic etching process such as the dry etching process known in the art.

As depicted in FIG. 4, in operation S3, the first protrusion structure is etched to form a second protrusion structure. Specifically, etching the first protrusion structure comprises the operations of (a) forming a hard mask layer on the first protrusion structure, (b) etching the first protrusion structure by using the hard mask layer as an etching mask to form the second protrusion structure, and (c) removing the hard mask layer. In the following, the operations (a) to (c) will be discussed in detail.

Figure 7A:
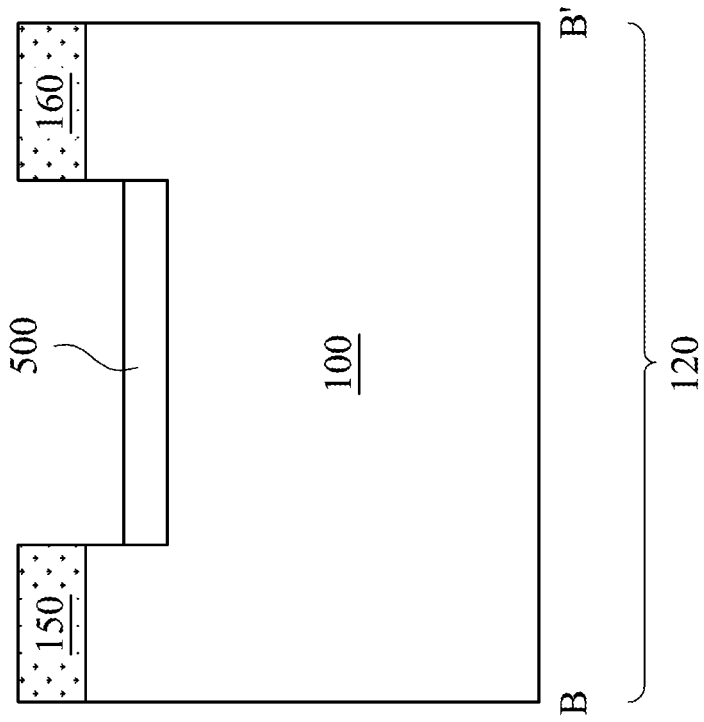
Figure 7B:
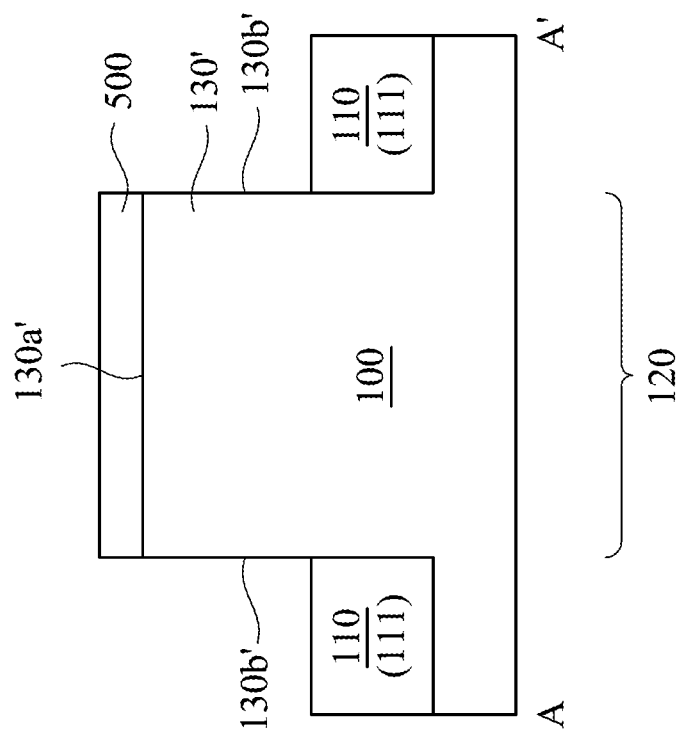

First, a hard mask layer 500 is formed on the first protrusion structure 130', as shown in FIGS. 1, 7A, and FIG. 7B. The hard mask layer 500 is disposed on the first protrusion structure 130' and substantially covers the top of the first protrusion structure 130'. In an embodiment of the present invention, forming the hard mask layer 500 is performed by suitable deposition methods including a chemical vapor deposition (CVD) process, an atomic layer deposition (ALD) process, a thermal oxidation process, a physical vapor deposition (PVD) process or a combination thereof. In an embodiment of the present invention, the hard mask layer 500 is made of silicon oxide, silicon nitride, silicon oxynitride, silicon carbide, another suitable material, or a combination thereof.

Figure 8B:
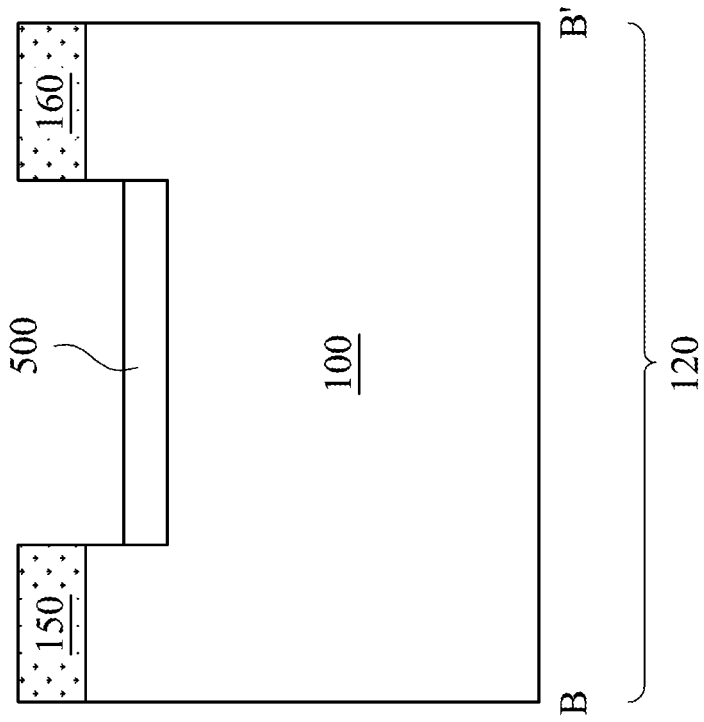
Figure 8A:
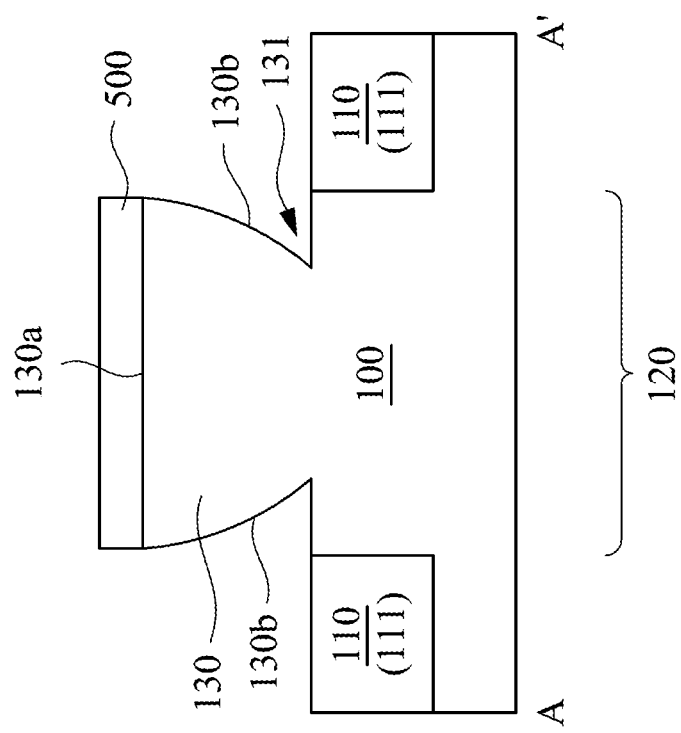

Subsequently, the first protrusion structure 130' is selectively etched by using the hard mask layer 500 as an etching mask to form a second protrusion structure 130, as shown in FIGS. 1, 8A, and 8B. Since the top surface 130a' of the first protrusion structure 130' is covered by the hard mask layer 500 and the sidewalls 130b' (shown in FIG. 7A) of the first protrusion structure 130' are exposed, a pair of undercuts 131 of the second protrusion structure 130 may be formed after the etching process. The pair of undercuts 131 is positioned at opposite sides of the protrusion structure 130, and extends along the second direction D2 at the periphery of the active area 120. Specifically, the etching of forming the pair of undercuts 131 may include a suitable etching process such as the reactive ion etching process known in the art. In addition, the etchant used in the etching process has an etch selectivity, so that the first portion 111 of the etched STI structure 110 remains substantially unchanged while the pair of undercuts 131 of the second protrusion structure 130 is formed. In other embodiments of the present invention, the etchant used in the etching process may be appropriately selected such that the etching rate of the first protrusion structure 130' is much greater than the etching rate of the first portion 111 of the etched STI structure 110. Therefore, the etched first portion 111 is slightly etched after the etching process.

Next, the hard mask layer 500 is removed. Specifically, the hard mask layer 500 is removed by etching processes such as a dry etching process or a wet etching process.

Figure 9B:
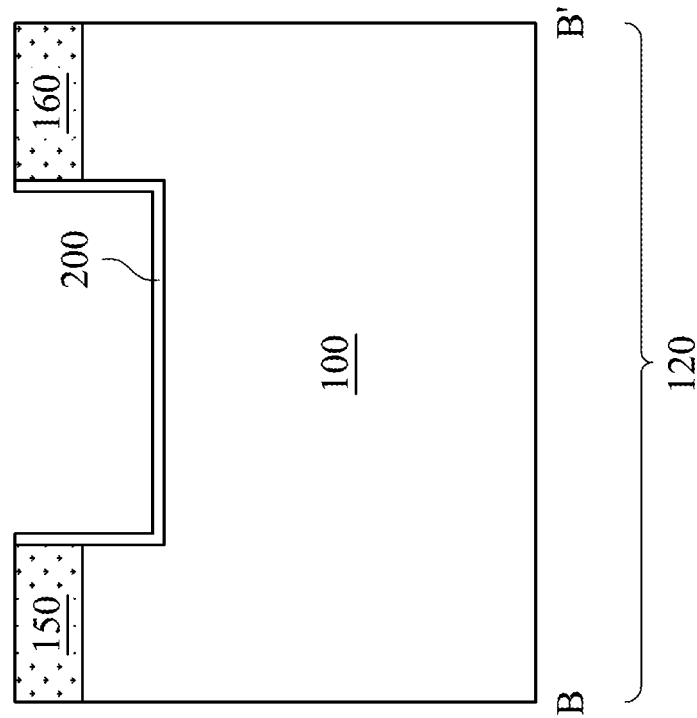
Figure 9A:
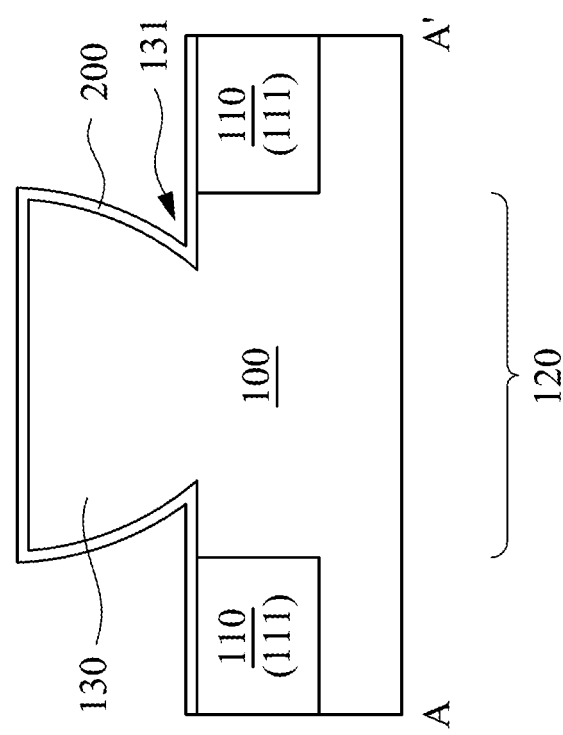

Referring to FIG. 4, in operation S4, a dielectric layer 200 is conformally formed covering the second protrusion structure 130, as shown in FIGS. 1, 9A, and 9B. The dielectric layer 200 overlays the protrusion structure 130 of the semiconductor substrate 100 and fills portions of the pair of undercuts 131 of the protrusion structure 130. Specifically, the dielectric layer 200 is disposed on the top surface and the sidewalls of the second protrusion structure 130, the top surface of the first portion 111 of the STI structure 110, and the sidewalls of the source semiconductor feature 150 and the drain semiconductor feature 160. The dielectric layer 200 substantially conformally covers the second protrusion structure 130. In an embodiment of the present invention, conformally forming the dielectric layer 200 is performed by suitable deposition methods including a CVD process, an ALD process, a thermal oxidation process, a PVD process or a combination thereof.

As depicted in FIG. 4, in operation S5, a gate structure 400 crossing over the second protrusion structure 130 is formed, as shown in FIGS. 1, 2A, and 2B. The gate structure 400 is formed crossing over the second protrusion structure 130 and on the first portion 111 of the STI structure 110. Specifically, the gate structure 400 extends in the first direction D1 that is substantially perpendicular to the second direction D2. The undercut 131 of the second protrusion structure 130 extends along the second direction D2. In an embodiment of the present invention, the formation of the gate structure 400 includes a deposition method such as a CVD process, a PVD process, or the like.

Figure 10B:
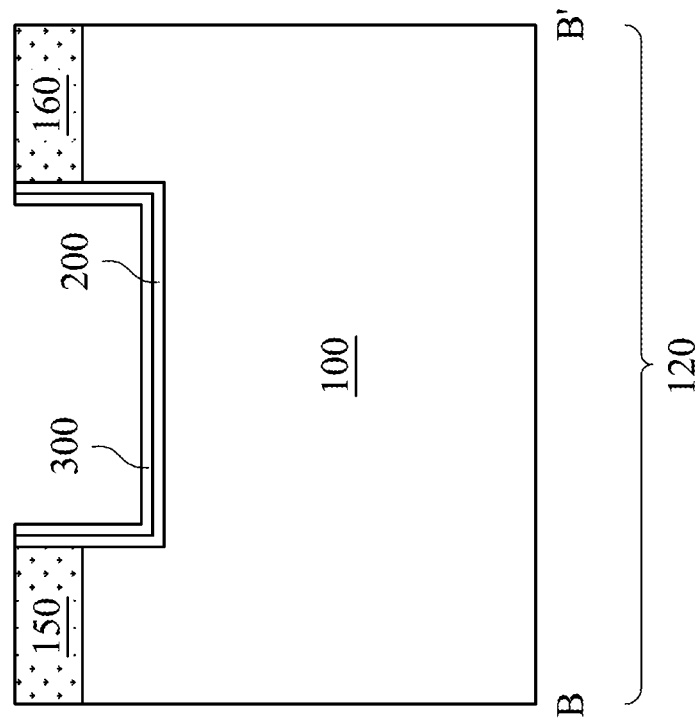
Figure 10A:
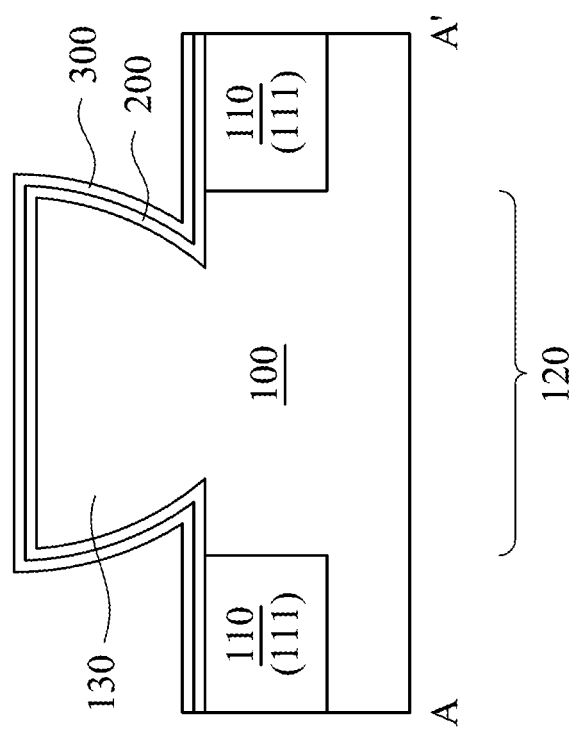

In other embodiments of the present invention, before the operation S5, an operation of conformally forming a barrier layer 300 over the dielectric layer 200 is performed, as shown in FIGS. 1, 10A, and 10B, the barrier layer 300 is formed. The barrier layer 300 substantially conformally covers the dielectric layer 200. In an embodiment of the present invention, the barrier layer 300 is formed by a suitable deposition method including a CVD process, a PVD process, or the like. Thereafter, the gate structure 400 is formed, as shown in FIGS. 1, 3A, and 3B. Specifically, the gate structure 400 crosses over the second protrusion structure 130 and covers the barrier layer 300. In an embodiment of the present invention, the gate structure 400 is formed by a suitable deposition method including a CVD process, a PVD process, or the like.

Figure 11:
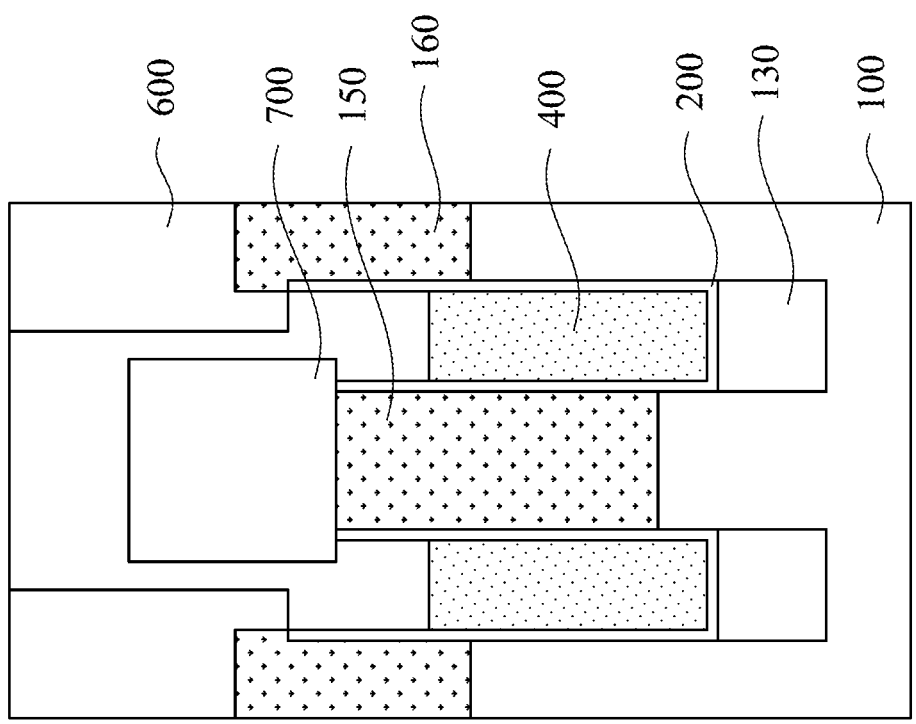
FIG. 11 is a cross-sectional view illustrating a portion of a DRAM device according to some embodiments of the present invention.

Please refer to FIG. 11. FIG. 11 is a cross-sectional view illustrating a portion of a DRAM device according to some embodiments of the present invention. Components similar to those in FIG. 1, FIG. 2A, and FIG. 2B are given the same reference numbers. The semiconductor device shown in FIG. 11 may further include a capacitor contact 600 connected to a capacitor (not shown) and a bit line contact 700 connected to a bit line (not shown). The source semiconductor feature 150 is through the bit line contact 700 electrically connected to the bit line. In addition, the drain semiconductor feature 160 is through the capacitor contact 600 electrically connected to the capacitor. The gate structure 400 is embedded in the semiconductor substrate 100, and separated from the protrusion structure 130 by the dielectric layer 200. Currents may be transmitted from the bit line contact 700 to the capacitor contact 600 through the source semiconductor feature 150, the protrusion structure 130, portions of the semiconductor substrate 100 opposite to the protrusion structure 130, the drain semiconductor feature 160, and eventually be transmitted to the capacitor (not shown). In this way, the data storage (e.g., data writing) can implemented. In an embodiment of the present invention, the source semiconductor feature 150 and the drain semiconductor feature 160 are doped with N-type dopants such as phosphorus or arsenic, and the semiconductor substrate 100 is doped with P-type dopants such as boron.

From the embodiments described above of the present invention, by forming the undercut 131 of the protrusion structure 130, the field-effect area of the gate structure 400 is thus increased as compared with conventional structure. Therefore, the gate structure 400 has a good gate-controlled ability, and the transistor has a good performance. In addition, the gate structure 400 of the present invention is embedded in the semiconductor substrate 100, which facilitates the planarization of the surface of the semiconductor device and increases the usable area of the surface of the semiconductor substrate 100.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
   a semiconductor substrate having an active area and a shallow trench isolation (STI) structure surrounding the active area, wherein the semiconductor substrate comprises a protrusion structure in the active area, the protrusion structure has an undercut at a periphery of the active area, and the STI structure comprises a first portion and two second portions;
   a dielectric layer overlaying the protrusion structure of the semiconductor substrate and filling at least a portion of the undercut of the protrusion structure;
   a gate structure crossing over the protrusion structure, wherein the gate structure is embedded in the semiconductor substrate and fills at least another portion of the undercut of the protrusion structure, the gate structure overlays the dielectric layer and the first portion of the STI structure, and the two second portions of the STI structure are respectively at opposite sides of the gate structure and are free of overlapping with the gate structure; and
   a source semiconductor feature and a drain semiconductor feature in the active area and positioned respectively at the opposite sides of the gate structure, wherein the source semiconductor feature and the drain semiconductor feature are doped semiconductor regions;
   wherein the second portion has a top surface that is higher than a top surface of the first portion of the STI structure, the protrusion structure has a top surface on a level between the top surface of the second portion and the top surface of the first portion of the STI structure, and a portion of the dielectric layer between the protrusion structure and the gate structure is lower than a bottom of the source semiconductor feature and a bottom of the drain semiconductor feature.

2. The semiconductor device of claim 1, wherein the gate structure extends in a first direction, and the undercut extends in a second direction that is substantially perpendicular to the first direction.

3. The semiconductor device of claim 1, wherein each of the source semiconductor feature and the drain semiconductor feature has a top surface higher than the top surface of the protrusion structure.

4. The semiconductor device of claim 1, wherein the protrusion structure has a top and a bottom, wherein a width of the bottom is about 99-70% of a width of the top.

5. The semiconductor device of claim 4, wherein the width of the bottom is about 25 nm to 35 nm.

6. The semiconductor device of claim 4, wherein the width of the top is about 30 nm to 38 nm.

7. The semiconductor device of claim 1, further comprising a barrier layer overlaying the dielectric layer.

8. The semiconductor device of claim 1, wherein a height of the gate structure ranges from 145 nm to 165 nm.

9. The semiconductor device of claim 1, wherein a height of the protrusion structure ranges from 35 nm to 45 nm.

10. The semiconductor device of claim 1, wherein the gate structure comprises poly silicon or a metal.

\* \* \* \* \*